(12) United States Patent
Xi

(10) Patent No.: US 11,735,600 B2
(45) Date of Patent: Aug. 22, 2023

(54) PIXEL LAYOUT AND DISPLAY PANEL HAVING PIXEL LAYOUT

(71) Applicant: SHENZHEN CHINA STAR OPTOELECTRONICS SEMICONDUCTOR DISPLAY TECHNOLOGY CO., LTD., Guangdong (CN)

(72) Inventor: Suping Xi, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 280 days.

(21) Appl. No.: 17/047,484

(22) PCT Filed: Jul. 13, 2020

(86) PCT No.: PCT/CN2020/101613
§ 371 (c)(1),
(2) Date: Oct. 14, 2020

(87) PCT Pub. No.: WO2021/232563
PCT Pub. Date: Nov. 25, 2021

(65) Prior Publication Data
US 2021/0366937 A1    Nov. 25, 2021

(30) Foreign Application Priority Data
May 19, 2020   (CN) .......................... 202010423309.7

(51) Int. Cl.
*H01L 27/12*     (2006.01)
*G02F 1/1362*    (2006.01)

(52) U.S. Cl.
CPC ...... *H01L 27/124* (2013.01); *G02F 1/136213* (2013.01); *G02F 1/136259* (2013.01); *G02F 1/136286* (2013.01); *H01L 27/1255* (2013.01)

(58) Field of Classification Search
CPC ............... H01L 27/124; H01L 27/1255; G02F 1/136213; G02F 1/136259; G02F 1/136286
(Continued)

(56) References Cited

U.S. PATENT DOCUMENTS

2002/0054037 A1   5/2002   Kawano
2007/0091241 A1   4/2007   Lin
(Continued)

FOREIGN PATENT DOCUMENTS

CN    1142057 A    2/1997
CN    101285977 A  10/2008
(Continued)

OTHER PUBLICATIONS

Chinese Office Action issued in corresponding Chinese Patent Application No. 202010423309.7 dated Oct. 24, 2022, pp. 1-10.

*Primary Examiner* — Charles S Chang
(74) *Attorney, Agent, or Firm* — PV IP PC; Wei Te Chung; Zhigang Ma

(57) ABSTRACT

A pixel layout and a display panel having the pixel layout are provided. The pixel layout includes a plurality of pixel repeating groups, and each of the pixel repeating groups is formed by two adjacent pixels. Two through-holes are positioned between the two pixels, and first ends of the two through-holes are respectively connected to pixel electrodes of the pixels. When one of the pixel electrodes of the two pixels has a voltage loss and the pixel thereof presents a dark spot, second ends of the two through-holes are connected to (Continued)

allow the pixel having the dark spot to display normally with help of the other pixel, thereby repairing the dark spot.

20 Claims, 2 Drawing Sheets

(58) Field of Classification Search
USPC .............................................. 349/54–55, 192
See application file for complete search history.

(56) References Cited

U.S. PATENT DOCUMENTS

2009/0256986 A1* 10/2009 Chen ................. G02F 1/136259
349/54
2010/0253870 A1    10/2010 Liao

FOREIGN PATENT DOCUMENTS

| CN | 101424792 A | 5/2009 |
|----|-------------|--------|
| CN | 101533844 A | 9/2009 |
| CN | 101614916 A | 12/2009 |
| CN | 101713892 A | 5/2010 |
| CN | 102402943 A | 4/2012 |
| CN | 102736341 A | 10/2012 |
| CN | 105741734 A | 7/2016 |
| CN | 110568678 A | 12/2019 |
| JP | 2002278476 A | 9/2002 |
| JP | 2006337453 A | 12/2006 |

* cited by examiner

PIXEL LAYOUT AND DISPLAY PANEL HAVING PIXEL LAYOUT

FIELD OF INVENTION

The present disclosure relates to the field of display technologies, and more particularly, to a pixel layout and a display panel having the pixel layout.

BACKGROUND OF INVENTION

When a display panel is switched to a three-color display mode of red, green, and blue, and a same pixel has a black dot in one of red, green, or blue display modes, it indicates that one of three sub-pixels of this pixel has a dark spot. Dark spots have influences on display of display panels' display areas (AA areas), and in particular black spots will appear on white screens. Therefore, pixel repairing for the dark spots is extremely important.

Technical problem: current pixel layouts usually use single pixel as a repeating unit, and when one of pixels has a dark state and is unable to be lit up, the pixel can only be darkened, which seriously affects display effect.

SUMMARY OF INVENTION

In view of this, it is necessary to provide a pixel layout and a display panel having the pixel layout to solve the technical problem that when one of pixels has a dark state and is unable to be lit up, the pixel can only be darkened.

In a first aspect, the present disclosure provides a pixel layout. The pixel layout includes a plurality of pixel repeating groups, wherein each of the pixel repeating groups includes an array substrate and a first pixel, a second pixel, a first through-hole, and a second through-hole defined on the array substrate; the first pixel is adjacent to the second pixel, and the first through-hole and the second through-hole are defined between the first pixel and the second pixel; a first end of the first through-hole is electrically connected to a pixel electrode of the first pixel, and a first end of the second through-hole is electrically connected to a pixel electrode of the second pixel; and when the pixel electrode of the first pixel or the pixel electrode of the second pixel has a voltage loss, a second end of the first through-hole is electrically connected to a second end of the second through-hole.

In some embodiments, the array substrate includes a spacing area defined between the first pixel and the second pixel, and the first through-hole and the second through-hole are positioned in the spacing area.

In some embodiments, the first pixel and the second pixel are arranged symmetrical to each other with respect to the spacing area.

In some embodiments, each of the pixel repeating groups further includes a common electrode line disposed on the array substrate, and the common electrode line includes a shared electrode line, a first extending part, and a second extending part; the first extending part and the second extending part are electrically connected to the shared electrode line respectively; the shared electrode line is positioned in the spacing area, the first extending part is positioned in the first pixel and on one side of the first pixel facing away from the shared electrode line, and the second extending part is positioned in the second pixel and on one side of the second pixel facing away from the shared electrode line; and the first extending part and the pixel electrode of the first pixel form a first storage capacitor, and the second extending part and the pixel electrode of the second pixel form a second storage capacitor.

In some embodiments, the first extending part and the second extending part are arranged symmetrical to each other with respect to the shared electrode line.

In some embodiments, each of the pixel repeating groups further includes a first gate electrode line, a second gate electrode line, a first data line, and a second data line disposed on the array substrate; the first gate electrode line and the second gate electrode line are parallel to each other along a first direction and spaced apart, the first data line and the second data line are parallel to each other along a second direction and spaced apart, and the first direction is perpendicular to the second direction; the first gate electrode line is arranged crosswise with the first data line and the second data line, and the second gate electrode line is arranged crosswise with the first data line and the second data line; and the first gate electrode line, the shared electrode line, the first data line, and the second data line surround and define a pixel area of the first pixel, and the second gate electrode line, the shared electrode line, the first data line, and the second data line surround and define a pixel area of the second pixel.

In some embodiments, each of the pixel repeating groups further includes a first thin film transistor and a second thin film transistor; the first thin film transistor is disposed in the pixel area of the first pixel, and the second thin film transistor is disposed in the pixel area of the second pixel; a gate electrode, a source electrode, and a drain electrode of the first thin film transistor are electrically connected to the first gate electrode line, the first data line, and the pixel electrode of the first pixel respectively and correspondingly; and a gate electrode, a source electrode, and a drain electrode of the second thin film transistor are electrically connected to the second gate electrode line, the second data line, and the pixel electrode of the second pixel respectively and correspondingly.

In some embodiments, the drain electrode of the first thin film transistor is electrically connected to the pixel electrode of the first pixel through a third through-hole, and the drain electrode of the second thin film transistor is electrically connected to the pixel electrode of the second pixel through a fourth through-hole.

In some embodiments, the gate electrodes of the first thin film transistor and the second thin film transistor, the first gate electrode line, the second gate electrode line, and the common electrode line are positioned in a first layer; the source electrodes of the first thin film transistor and the second thin film transistor, the drain electrodes of the first thin film transistor and the second thin film transistor, the first data line, and the second data line are positioned in a second layer; the pixel electrodes of the first pixel and the second pixel are positioned in a third layer; and the first layer, the second layer, and the third layer are disposed in sequence from bottom to top.

In some embodiments, when the pixel electrode of the first pixel or the pixel electrode of the second pixel has the voltage loss, the second end of the first through-hole is electrically connected to the second end of the second through-hole in the second layer or the third layer.

In another aspect, an embodiment of the present disclosure further provides a display panel including the above pixel layout. The pixel layout includes a plurality of pixel repeating groups, wherein each of the pixel repeating groups includes an array substrate and a first pixel, a second pixel, a first through-hole, and a second through-hole defined on the array substrate; the first pixel is adjacent to the second pixel, and the first through-hole and the second through-hole are defined between the first pixel and the second pixel; a first end of the first through-hole is electrically connected to a pixel electrode of the first pixel, and a first end of the second through-hole is electrically connected to a pixel electrode of the second pixel; and when the pixel electrode of the first pixel or the pixel electrode of the second pixel has a voltage loss, a second end of the first through-hole is electrically connected to a second end of the second through-hole.

In some embodiments, the array substrate includes a spacing area defined between the first pixel and the second pixel, and the first through-hole and the second through-hole are positioned in the spacing area.

In some embodiments, the first pixel and the second pixel are arranged symmetrical to each other with respect to the spacing area.

In some embodiments, each of the pixel repeating groups further includes a common electrode line disposed on the array substrate, and the common electrode line includes a shared electrode line, a first extending part, and a second extending part; the first extending part and the second extending part are electrically connected to the shared electrode line respectively; the shared electrode line is positioned in the spacing area, the first extending part is positioned in the first pixel and on one side of the first pixel facing away from the shared electrode line, and the second extending part is positioned in the second pixel and on one side of the second pixel facing away from the shared electrode line; and the first extending part and the pixel electrode of the first pixel form a first storage capacitor, and the second extending part and the pixel electrode of the second pixel form a second storage capacitor.

In some embodiments, the shared electrode line is positioned in the spacing area, and a projection of the shared electrode line on the array substrate coincides with projections of the first through-hole and the second through-hole on the array substrate.

In some embodiments, the first extending part and the second extending part are arranged symmetrical to each other with respect to the shared electrode line.

In some embodiments, each of the pixel repeating groups further includes a first gate electrode line, a second gate electrode line, a first data line, and a second data line disposed on the array substrate; the first gate electrode line and the second gate electrode line are parallel to each other along a first direction and spaced apart, the first data line and the second data line are parallel to each other along a second direction and spaced apart, and the first direction is perpendicular to the second direction; the first gate electrode line is arranged crosswise with the first data line and the second data line, and the second gate electrode line is arranged crosswise with the first data line and the second data line; and the first gate electrode line, the shared electrode line, the first data line, and the second data line surround and define a pixel area of the first pixel, and the second gate electrode line, the shared electrode line, the first data line, and the second data line surround and define a pixel area of the second pixel.

In some embodiments, each of the pixel repeating groups further includes a first thin film transistor and a second thin film transistor; the first thin film transistor is disposed in the pixel area of the first pixel, and the second thin film transistor is disposed in the pixel area of the second pixel; a gate electrode, a source electrode, and a drain electrode of the first thin film transistor are electrically connected to the first gate electrode line, the first data line, and the pixel electrode of the first pixel respectively and correspondingly; and a gate electrode, a source electrode, and a drain electrode of the second thin film transistor are electrically connected to the second gate electrode line, the second data line, and the pixel electrode of the second pixel respectively and correspondingly.

In some embodiments, the drain electrode of the first thin film transistor is electrically connected to the pixel electrode of the first pixel through a third through-hole, and the drain electrode of the second thin film transistor is electrically connected to the pixel electrode of the second pixel through a fourth through-hole.

Beneficial effect: the present disclosure provides a pixel layout and a display panel having the pixel layout. The pixel layout includes a plurality of pixel repeating groups, wherein each of the pixel repeating groups includes a first pixel and a second pixel. A first through-hole and a second through-hole are positioned between the first pixel and the second pixel, a first end of the first through-hole is electrically connected to a pixel electrode of the first pixel, and a first end of the second through-hole is electrically connected to a pixel electrode of the second pixel. When the pixel electrode of the first pixel or the pixel electrode of the second pixel has a voltage loss and that causes the first pixel or the second pixel to have a dark spot defect, a second end of the first through-hole and a second end of the second through-hole are electrically connected, thereby connecting the pixel electrode of the pixel having the dark spot defect to the pixel electrode of the other pixel to allow the pixel having the dark spot defect to display normally with help of the other pixel, thereby repairing the pixel having the dark spot defect. In addition, since the first through-hole and the second through-hole are positioned between the two pixels, overall aperture ratio of the pixels is not affected.

DETAILED DESCRIPTION OF PREFERRED EMBODIMENTS

In order to make the purpose, technical solutions, and effects of the present disclosure clearer and more definite, the following further describes the present disclosure in detail with reference to the drawings and embodiments. It should be understood that the specific embodiments described herein are only used to explain the disclosure, and are not used to limit the disclosure.

Figure 1:
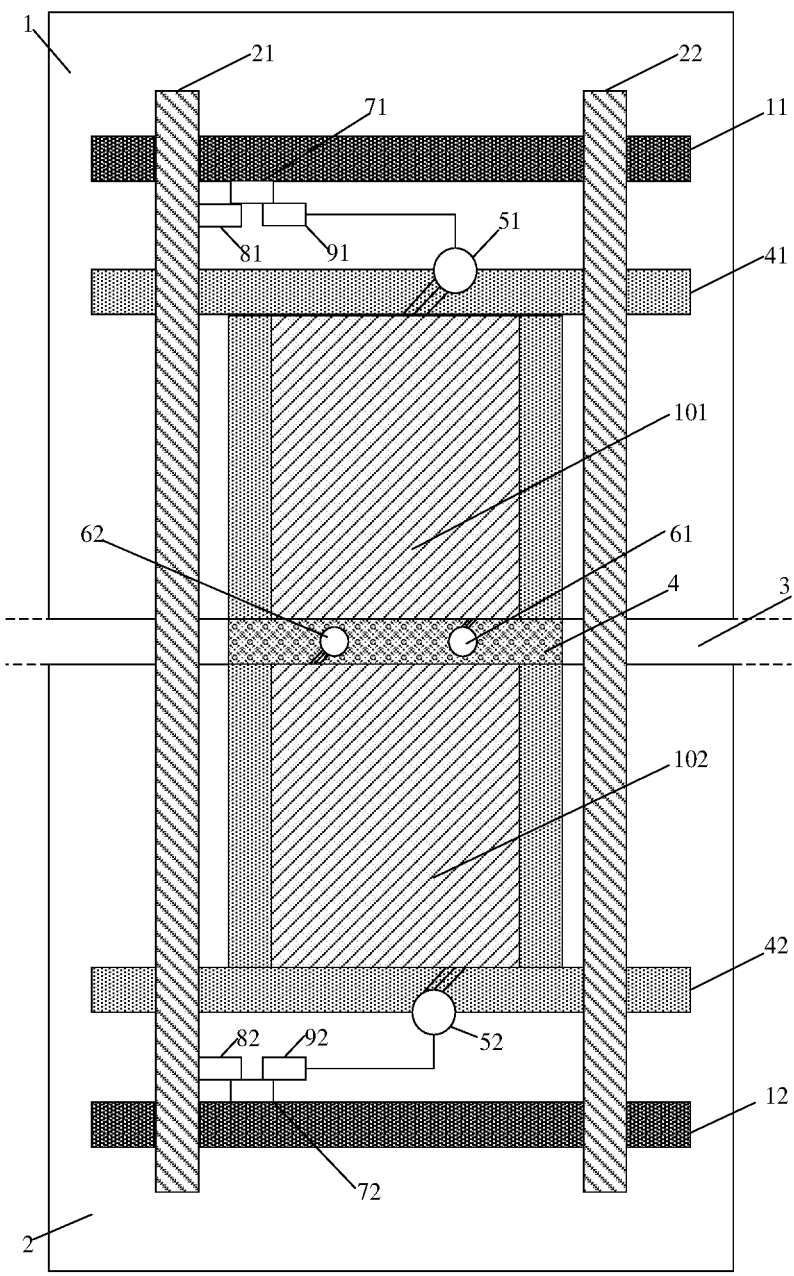
FIG. 1 is a schematic structural diagram of a pixel layout according to an embodiment of the present disclosure.

FIG. 1 is a schematic structural diagram of a pixel layout according to an embodiment of the present disclosure. Referring to FIG. 1, an embodiment of the present disclosure provides the pixel layout. The pixel layout includes a plurality of pixel repeating groups, wherein each of the pixel repeating groups includes an array substrate and a first pixel 1, a second pixel 2, a first through-hole 61, and a second through-hole 62 defined on the array substrate. The first pixel 1 is adjacent to the second pixel 2, and the first through-hole 61 and the second through-hole 62 are defined between the first pixel 1 and the second pixel 2; a first end of the first through-hole 61 is electrically connected to a pixel electrode 101 of the first pixel, and a first end of the second through-hole 62 is electrically connected to a pixel electrode 102 of the second pixel; and when the pixel electrode 101 of the first pixel 1 or the pixel electrode 102 of the second pixel 2 has a voltage loss, a second end of the first through-hole 61 is electrically connected to a second end of the second through-hole 62.

Specifically, in order not to affect overall aperture ratio of the first pixel 1 and the second pixel 2 and electrical connections among wirings in the pixel layout, the first through-hole 61 and the second through-hole 62 are positioned between the first pixel 1 and the second pixel 2. Wherein, the first end of the first through-hole 61 is electrically connected to the pixel electrode 101 of the first pixel, the first end of the second through-hole 62 is electrically connected to the pixel electrode 102 of the second pixel, and another end of the first through-hole 61 and another end of the second through-hole 62 are in a floating state, so that when the pixel electrode 101 of the first pixel has the voltage loss and causes the first pixel 1 to have a dark spot or when the pixel electrode 102 of the second pixel has the voltage loss and causes the second pixel 2 to have the dark spot, the second end of the first through-hole 61 and the second end of the second through-hole 62 can be electrically connected, thereby allowing one pixel having the dark spot to display normally with help of another pixel adjacent thereto.

The pixel layout provided by this embodiment of the present disclosure positioned the first through-hole 61 and the second through-hole 62 between the first pixel 1 and the second pixel 2 adjacent to each other, the first through-hole 61 is electrically connected to the pixel electrode 101 of the first pixel, and the second through-hole 62 is electrically connected to the pixel electrode 102 of the second pixel. When the pixel electrode 101 of the first pixel or the pixel electrode 102 of the second pixel has the voltage loss and that causes the first pixel 1 or the second pixel 2 to have a dark spot defect, the second end of the first through-hole 61 and the second end of the second through-hole 62 are electrically connected, thereby connecting the pixel electrode of the pixel having the dark spot defect to the pixel electrode of the other pixel to allow the pixel having the dark spot defect to display normally with help of the other pixel, thereby repairing the pixel having the dark spot defect. In addition, since the first through-hole 61 and the second through-hole 62 are positioned between the first pixel 1 and the second pixel 2, overall aperture ratio of the pixels is not affected.

It can be understood that FIG. 1 uses two pixels adjacent to each other in a same column of two stages of gate driver on array (GOA) units as one pixel repeating group, and actually, two pixels adjacent to each other of a same staged GOA unit can also be used as one pixel repeating group.

It should be noted that specifically, the second end of the first through-hole 61 being electrically connected to the second end of the second through-hole 62 is achieved by using laser to weld the second end of the first through-hole 61 and the second end of the second through-hole 62 together.

Referring to FIG. 1, the array substrate includes a spacing area 3 defined between the first pixel 1 and the second pixel 2, and the first through-hole 61 and the second through-hole 62 are positioned in the spacing area 3, thereby preventing the overall aperture ratio of the pixel layout from being affected.

It should be noted that the first pixel 1 and the second pixel 2 are arranged symmetrical to each other with respect to the spacing area 3.

Referring to FIG. 1, each of the pixel repeating groups further includes a common electrode line disposed on the array substrate, and the common electrode line includes a shared electrode line 4, a first extending part 41, and a second extending part 42. The shared electrode line 4 is positioned in the spacing area 3, the first extending part 41 is positioned in the first pixel 1 and on one side of the first pixel 1 facing away from the shared electrode line 4, and the second extending part 42 is positioned in the second pixel 2 and on one side of the second pixel 2 facing away from the shared electrode line 4. The first extending part 41 and the second extending part 42 are electrically connected to the shared electrode line 4 respectively. It should be noted that the shared electrode line 4, the first extending part 41, and the second extending part 42 together form the common electrode line. The first extending part 41 and the pixel electrode 101 of the first pixel form a first storage capacitor to keep a charged voltage of the first pixel 1 until a moment of a next updated image, and the second extending part 42 and the pixel electrode 102 of the second pixel form a second storage capacitor to keep a charged voltage of the second pixel 2 until a moment of a next updated image.

In addition, in order to facilitate the electrical connections between the first through-hole 61 and the first pixel 1 and between the second through-hole 62 and the second pixel 2, and to prevent wirings between the second end of the first through-hole 61 and the pixel electrode 101 of the first pixel and between the second end of the second through-hole 62 and the pixel electrode 102 of the second pixel from being too long, a projection of the shared electrode line 4 on the array substrate coincides with projections of the first through-hole 61 and the second through-hole 62 on the array substrate.

It should be noted that the first extending part 41 and the second extending part 42 may be arranged symmetrical to each other with respect to the shared electrode line 4.

Referring to FIG. 1, each of the pixel repeating groups further includes a first gate electrode line 11, a second gate electrode line 12, a first data line 21, and a second data line 22 disposed on the array substrate. The first gate electrode line 11 and the second gate electrode line 12 are parallel to each other along a first direction and spaced apart, the first data line 21 and the second data line 22 are parallel to each other along a second direction and spaced apart, and the first direction is perpendicular to the second direction. The first gate electrode line 11 is arranged crosswise with the first data line 21 and the second data line 22, and the second gate electrode line 12 is arranged crosswise with the first data line 21 and the second data line 22. The first gate electrode line 11, the shared electrode line 4, the first data line 21, and the second data line 22 surround and define a pixel area of the first pixel, and the second gate electrode line 12, the shared electrode line 4, the first data line 21, and the second data line 22 surround and define a pixel area of the second pixel.

Further, each of the pixel repeating groups further includes a first thin film transistor and a second thin film transistor. The first thin film transistor is disposed in the pixel area of the first pixel 1, and the second thin film transistor is disposed in the pixel area of the second pixel 2. A gate electrode 71, a source electrode 81, and a drain electrode 91 of the first thin film transistor are electrically connected to the first gate electrode line 11, the first data line 21, and the pixel electrode 101 of the first pixel respectively and correspondingly. A gate electrode 72, a source electrode 82, and a drain electrode 92 of the second thin film transistor are electrically connected to the second gate electrode line 12, the second data line 22, and the pixel electrode 102 of the second pixel respectively and correspondingly.

It should be noted that the source electrode 81 and the drain electrode 91 of the first thin film transistor are interchangeable, and the source electrode 82 and the drain electrode 92 of the second thin film transistor are also interchangeable depending on the first thin film transistor and second thin film transistor being an N-type thin film transistor or a P-type thin film transistor.

It should be noted that the drain electrode 91 of the first thin film transistor is electrically connected to the pixel electrode 101 of the first pixel through a third through-hole 51, and the drain electrode 92 of the second thin film transistor is electrically connected to the pixel electrode 102 of the second pixel through a fourth through-hole 52.

In some embodiments, the gate electrodes 71 of the first thin film transistor, the gate electrodes 72 of the second thin film transistor, the first gate electrode line 11, the second gate electrode line 12, and the common electrode line (the shared electrode line 4, the first extending part 41, and the second extending part 42) are positioned in a first layer; the source electrode 81 of the first thin film transistor, the source electrode 82 of the second thin film transistor, the drain electrode 91 of the first thin film transistor, the drain electrode 92 of the second thin film transistor, the first data line 21, and the second data line 22 are positioned in a second layer; and the pixel electrode 101 of the first pixel and the pixel electrode 102 of the second pixel are positioned in a third layer. Wherein, the first layer, the second layer, and the third layer are disposed in sequence from bottom to top.

Specifically, in terms of profile positions, the pixel layout provided by the embodiment of the present disclosure uses a bottom gate type structure. Wherein, the gate electrode 71 of the first thin film transistor, the first gate electrode line 11, the gate electrode 72 of the second thin film transistor, the first gate electrode line 12, and the common electrode line (the shared electrode line 4, the first extending part 41, and the second extending part 42) are in a same layer, that is, the first layer. The source electrode 81 of the first thin film transistor, the first data line 21, the source electrode 82 of the second thin film transistor, the drain electrode 91 of the first thin film transistor, the second data line 22, and the drain electrode 92 of the second thin film transistor are in a same layer, that is, the second layer. The pixel electrode 101 of the first pixel and the pixel electrode 102 of the second pixel are in a same layer, that is, the third layer. The first layer, the second layer, and the third layer are disposed in sequence from bottom to top.

Further, the pixel layout can also use a top gate type structure, so the common electrode line and the pixel electrodes can be disposed in different layers according to needs, the gate electrodes of the thin film transistors and the gate electrode lines are in a same layer, and the source electrodes and the drain electrodes of the thin film transistors and the data lines are in another same layer.

In some embodiments, the pixel electrode 101 of the first pixel and the pixel electrode 102 of the second pixel in FIG. 1 are monodomain structures. Actually, the pixel electrode 101 of the first pixel and the pixel electrode 102 of the second pixel may also be multidomain structures, such as four-domain structures and eight-domain structures, which is not limited herein.

Figure 2:
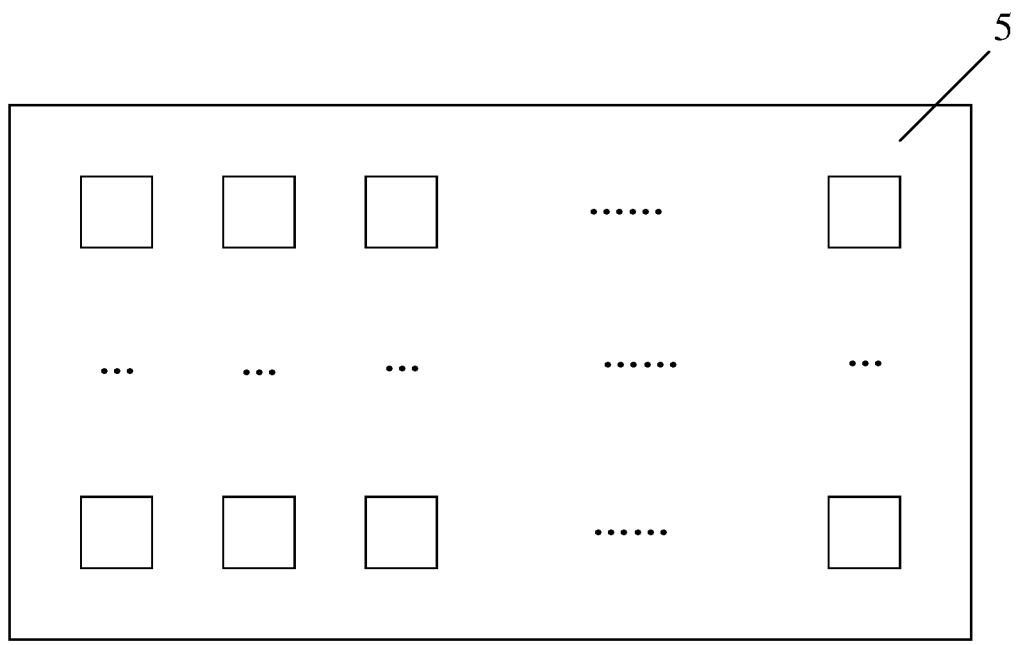
FIG. 2 is a schematic structural diagram of a display panel according to an embodiment of the present disclosure.

FIG. 2 is a schematic structural diagram of a display panel according to an embodiment of the present disclosure. Referring to FIG. 2, an embodiment of the present disclosure further provides a display panel 5 including the above pixel layout (each small square in FIG. 2 is a pixel repeating group). The display panel has same structures and beneficial effects as the pixel layout provided by the above embodiment. Since the above embodiment has described the structures and the beneficial effects of the pixel layout in detail, it will not be repeated here.

It can be understood that for a person of ordinary skill in the art, equivalent replacements or changes can be made according to the technical solution of the present disclosure and its inventive concept, and all these changes or replacements should fall within the protection scope of the claims attached to the present disclosure.

What is claimed is:

1. A pixel layout, comprising a plurality of pixel repeating groups,
    wherein each of the pixel repeating groups comprises an array substrate and a first pixel, a second pixel, a first through-hole, and a second through-hole defined on the array substrate;
    the array substrate comprises a spacing area defined between the first pixel and the second pixel, and a pixel electrode of the first pixel and a pixel electrode of the second pixel are spaced apart from each other by the spacing area;
    the first pixel is adjacent to the second pixel, the first through-hole and the second through-hole are defined between the first pixel and the second pixel, and each of the first through-hole and the second through-hole is electrically conductive; and
    a first end of the first through-hole is electrically connected to the pixel electrode of the first pixel, and a first end of the second through-hole is electrically connected to the pixel electrode of the second pixel, so that the pixel electrode of the first pixel and the pixel electrode of the second pixel are electrically connected by electrically connecting a second end of the first through-hole to a second end of the second through-hole, when one of the pixel electrode of the first pixel and the pixel electrode of the second pixel has a voltage loss to cause one of the first pixel and the second pixel to have a dark spot defect.

2. The pixel layout according to claim 1, wherein the first through-hole and the second through-hole are positioned in the spacing area.

3. The pixel layout according to claim 2, wherein the first pixel and the second pixel are arranged symmetrical to each other with respect to the spacing area.

4. The pixel layout according to claim 2, wherein each of the pixel repeating groups further comprises a common electrode line disposed on the array substrate, and the common electrode line comprises a shared electrode line, a first extending part, and a second extending part;
    the first extending part and the second extending part are electrically connected to the shared electrode line respectively;
    the shared electrode line is positioned in the spacing area, the first extending part is positioned in the first pixel and on one side of the first pixel facing away from the shared electrode line, and the second extending part is positioned in the second pixel and on one side of the second pixel facing away from the shared electrode line; and
    the first extending part and the pixel electrode of the first pixel form a first storage capacitor, and the second extending part and the pixel electrode of the second pixel form a second storage capacitor.

5. The pixel layout according to claim 4, wherein a projection of the shared electrode line on the array substrate coincides with projections of the first through-hole and the second through-hole on the array substrate.

6. The pixel layout according to claim 4, wherein the first extending part and the second extending part are arranged symmetrical to each other with respect to the shared electrode line.

7. The pixel layout according to claim 4, wherein each of the pixel repeating groups further comprises a first gate electrode line, a second gate electrode line, a first data line, and a second data line disposed on the array substrate;
the first gate electrode line and the second gate electrode line are parallel to each other along a first direction and spaced apart, the first data line and the second data line are parallel to each other along a second direction and spaced apart, and the first direction is perpendicular to the second direction;
the first gate electrode line is arranged crosswise with the first data line and the second data line, and the second gate electrode line is arranged crosswise with the first data line and the second data line; and
the first gate electrode line, the shared electrode line, the first data line, and the second data line surround and define a pixel area of the first pixel, and the second gate electrode line, the shared electrode line, the first data line, and the second data line surround and define a pixel area of the second pixel.

8. The pixel layout according to claim 7, wherein each of the pixel repeating groups further comprises a first thin film transistor and a second thin film transistor;
the first thin film transistor is disposed in the pixel area of the first pixel, and the second thin film transistor is disposed in the pixel area of the second pixel;
a gate electrode, a source electrode, and a drain electrode of the first thin film transistor are electrically connected to the first gate electrode line, the first data line, and the pixel electrode of the first pixel respectively and correspondingly; and
a gate electrode, a source electrode, and a drain electrode of the second thin film transistor are electrically connected to the second gate electrode line, the second data line, and the pixel electrode of the second pixel respectively and correspondingly.

9. The pixel layout according to claim 8, wherein the drain electrode of the first thin film transistor is electrically connected to the pixel electrode of the first pixel through a third through-hole, and the drain electrode of the second thin film transistor is electrically connected to the pixel electrode of the second pixel through a fourth through-hole.

10. The pixel layout according to claim 8, wherein the gate electrodes of the first thin film transistor and the second thin film transistor, the first gate electrode line, the second gate electrode line, and the common electrode line are positioned in a first layer;
the source electrodes of the first thin film transistor and the second thin film transistor, the drain electrodes of the first thin film transistor and the second thin film transistor, the first data line, and the second data line are positioned in a second layer;
the pixel electrodes of the first pixel and the second pixel are positioned in a third layer; and
the first layer, the second layer, and the third layer are disposed in sequence from bottom to top.

11. The pixel layout according to claim 10, wherein when the pixel electrode of the first pixel or the pixel electrode of the second pixel has the voltage loss, the second end of the first through-hole is electrically connected to the second end of the second through-hole in the second layer or the third layer.

12. A display panel, comprising a pixel layout comprising a plurality of pixel repeating groups,
wherein each of the pixel repeating groups comprises an array substrate and a first pixel, a second pixel, a first through-hole, and a second through-hole defined on the array substrate;
the array substrate comprises a spacing area defined between the first pixel and the second pixel, and a pixel electrode of the first pixel and a pixel electrode of the second pixel are spaced apart from each other by the spacing area;
the first pixel is adjacent to the second pixel, the first through-hole and the second through-hole are defined between the first pixel and the second pixel, and each of the first through-hole and the second through-hole is electrically conductive; and
a first end of the first through-hole is electrically connected to the pixel electrode of the first pixel, and a first end of the second through-hole is electrically connected to the pixel electrode of the second pixel, so that the pixel electrode of the first pixel and the pixel electrode of the second pixel are electrically connected by electrically connecting a second end of the first through-hole to a second end of the second through-hole, when one of the pixel electrode of the first pixel and the pixel electrode of the second pixel has a voltage loss to cause one of the first pixel and the second pixel to have a dark spot defect.

13. The display panel according to claim 12, wherein the first through-hole and the second through-hole are positioned in the spacing area.

14. The display panel according to claim 13, wherein the first pixel and the second pixel are arranged symmetrical to each other with respect to the spacing area.

15. The display panel according to claim 13, wherein each of the pixel repeating groups further comprises a common electrode line disposed on the array substrate, and the common electrode line comprises a shared electrode line, a first extending part, and a second extending part;
the first extending part and the second extending part are electrically connected to the shared electrode line respectively;
the shared electrode line is positioned in the spacing area, the first extending part is positioned in the first pixel and on one side of the first pixel facing away from the shared electrode line, and the second extending part is positioned in the second pixel and on one side of the second pixel facing away from the shared electrode line; and
the first extending part and the pixel electrode of the first pixel form a first storage capacitor, and the second extending part and the pixel electrode of the second pixel form a second storage capacitor.

16. The display panel according to claim 15, wherein a projection of the shared electrode line on the array substrate coincides with projections of the first through-hole and the second through-hole on the array substrate.

17. The display panel according to claim 15, wherein the first extending part and the second extending part are arranged symmetrical to each other with respect to the shared electrode line.

18. The display panel according to claim 15, wherein each of the pixel repeating groups further comprises a first gate electrode line, a second gate electrode line, a first data line, and a second data line disposed on the array substrate;
the first gate electrode line and the second gate electrode line are parallel to each other along a first direction and spaced apart, the first data line and the second data line are parallel to each other along a second direction and spaced apart, and the first direction is perpendicular to the second direction;

the first gate electrode line is arranged crosswise with the first data line and the second data line, and the second gate electrode line is arranged crosswise with the first data line and the second data line; and the first gate electrode line, the shared electrode line, the first data line, and the second data line surround and define a pixel area of the first pixel, and the second gate electrode line, the shared electrode line, the first data line, and the second data line surround and define a pixel area of the second pixel.

19. The display panel according to claim 18, wherein each of the pixel repeating groups further comprises a first thin film transistor and a second thin film transistor;

the first thin film transistor is disposed in the pixel area of the first pixel, and the second thin film transistor is disposed in the pixel area of the second pixel;

a gate electrode, a source electrode, and a drain electrode of the first thin film transistor are electrically connected to the first gate electrode line, the first data line, and the pixel electrode of the first pixel respectively and correspondingly; and a gate electrode, a source electrode, and a drain electrode of the second thin film transistor are electrically connected to the second gate electrode line, the second data line, and the pixel electrode of the second pixel respectively and correspondingly.

20. The display panel according to claim 19, wherein the drain electrode of the first thin film transistor is electrically connected to the pixel electrode of the first pixel through a third through-hole, and the drain electrode of the second thin film transistor is electrically connected to the pixel electrode of the second pixel through a fourth through-hole.

* * * * *